US009263541B2

(12) United States Patent
Siddiqui et al.

(10) Patent No.: US 9,263,541 B2
(45) Date of Patent: Feb. 16, 2016

(54) ALTERNATIVE GATE DIELECTRIC FILMS FOR SILICON GERMANIUM AND GERMANIUM CHANNEL MATERIALS

(71) Applicant: GLOBALFOUNDRIES Inc., Grand Cayman (KY)

(72) Inventors: Shariq Siddiqui, Albany, NY (US);
Bhagawan Sahu, Watervliet, NY (US);
Rohit Galatage, Clifton Park, NY (US);
Hoon Kim, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/261,559

(22) Filed: Apr. 25, 2014

(65) Prior Publication Data
US 2015/0311308 A1    Oct. 29, 2015

(51) Int. Cl.
*H01L 21/00* (2006.01)
*H01L 21/16* (2006.01)
*H01L 29/51* (2006.01)
*H01L 21/02* (2006.01)

(52) U.S. Cl.
CPC ............ *H01L 29/513* (2013.01); *H01L 21/022* (2013.01); *H01L 21/02178* (2013.01); *H01L 21/02186* (2013.01); *H01L 21/02189* (2013.01); *H01L 21/02192* (2013.01); *H01L 29/517* (2013.01)

(58) Field of Classification Search
CPC ..................... H01L 21/0228; H01L 21/02529; H01L 21/02252; H01L 21/02392; H01L 21/0425; H01L 21/28079; H01L 21/28255; H01L 21/2807; H01L 21/31641; H01L 21/31645; H01L 21/31658; H01L 27/1104; H01L 27/0251; H01L 29/435; H01L 29/0852; H01L 29/7869
USPC ......... 438/104, 240, 197, 287, 261, 769, 770, 438/785, 763, 761, 778, 779; 257/E21.006, 257/E21.045, E21.051, E21.054, E21.085, 257/E21.092, E21.115, E21.126, E21.127, 257/E21.129, E21.17, E21.267, E21.278, 257/E21.293, E21.301, E21.302
See application file for complete search history.

(56) References Cited

U.S. PATENT DOCUMENTS

| | | | | |
|---|---|---|---|---|
| 4,837,176 | A * | 6/1989 | Zdebel et al. ................ | 438/552 |
| 6,573,547 | B2 * | 6/2003 | Ahn et al. ..................... | 257/296 |
| 6,627,503 | B2 * | 9/2003 | Ma et al. ...................... | 438/287 |
| 7,501,320 | B2 * | 3/2009 | Park et al. ..................... | 438/238 |
| 8,420,208 | B2 | 4/2013 | Huang et al. | |

* cited by examiner

*Primary Examiner* — David Nhu
(74) *Attorney, Agent, or Firm* — Williams Morgan, P.C.

(57) ABSTRACT

Embodiments of the present invention provide a high-K dielectric film for use with silicon germanium (SiGe) or germanium channel materials, and methods of fabrication. As a first step of this process, an interfacial layer (IL) is formed on the semiconductor substrate providing reduced interface trap density. However, an ultra-thin layer is used as a barrier film to avoid germanium diffusion in high-k film and oxygen diffusion from the high-k film to the interfacial layer (IL), therefore, dielectric films such as aluminum oxide ($Al_2O_3$), zirconium oxide, or lanthanum oxide ($La_2O_3$) may be used. In addition, these films can provide high thermal budget. A second dielectric layer is then deposited on the first dielectric layer. The second dielectric layer is a high-k dielectric layer, providing a reduced effective oxide thickness (EOT), resulting in improved device performance.

20 Claims, 4 Drawing Sheets

ALTERNATIVE GATE DIELECTRIC FILMS FOR SILICON GERMANIUM AND GERMANIUM CHANNEL MATERIALS

FIELD OF THE INVENTION

The present invention relates generally to semiconductor fabrication, and more particularly, to gate dielectric films for silicon germanium and germanium channel materials.

BACKGROUND

As technology dimensions scale for semiconductor integrated circuits (ICs), new challenges are being created with regards to metal-oxide semiconductor field-effect transistors (MOSFETs). Silicon germanium and germanium channel materials are being introduced due to higher mobility (electrons and holes) when compared to conventional Si devices. In order to continuously scale devices, maintaining equivalent oxide thickness (EOT) and gate leakage are needed to meet stringent requirements. In addition to channel materials, scaling further requires gate dielectric materials with higher k values. It is therefore desirable to have improvements in dielectric films and methods of fabrication.

SUMMARY

Embodiments of the present invention provide a high-K dielectric film for use with silicon germanium (SiGe) or germanium channel materials and methods of fabrication. As a first step of this process, an interfacial layer (IL) is formed on the semiconductor substrate providing reduced interface trap density. However, an ultra-thin layer is used as a barrier film to avoid germanium diffusion in high-k film and oxygen diffusion from the high-k film to the interfacial layer (IL). Therefore, dielectric films such as aluminum oxide ($Al_2O_3$), zirconium oxide, or lanthanum oxide ($La_2O_3$) may be used. In addition, these films can provide high thermal budget. A second dielectric layer is then deposited on the first dielectric layer. The second dielectric layer is a high-k dielectric layer providing a reduced effective oxide thickness (EOT), resulting in improved device performance.

In a first aspect, embodiments of the present invention provide a method of forming a semiconductor structure, comprising: performing a surface oxidation of a semiconductor substrate to form an interfacial oxide layer; depositing a first dielectric layer on the interfacial oxide layer; and depositing a second dielectric layer on the first dielectric layer.

In a second aspect, embodiments of the present invention provide a semiconductor structure comprising: a silicon germanium substrate comprising an oxidized top surface; a first dielectric layer disposed on the oxidized top surface of the silicon germanium substrate; and a second dielectric layer disposed on the first dielectric layer.

In a third aspect, embodiments of the present invention provide a semiconductor structure comprising: a semiconductor substrate; a transistor gate disposed on the semiconductor substrate; a gate dielectric disposed between the semiconductor substrate and the transistor gate, wherein the gate dielectric comprises an oxidized surface region of the semiconductor substrate, an aluminum oxide layer disposed on the oxidized surface region, and a high-K dielectric layer disposed on the aluminum oxide layer.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1A:
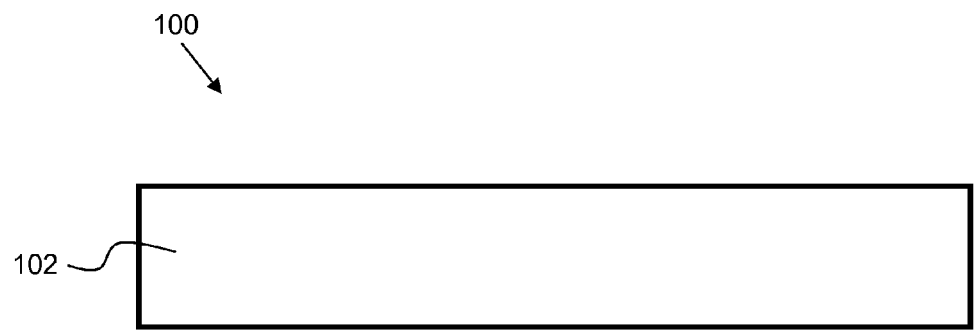

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1A shows a semiconductor structure at a starting point for embodiments of the present invention.

Figure 1B:
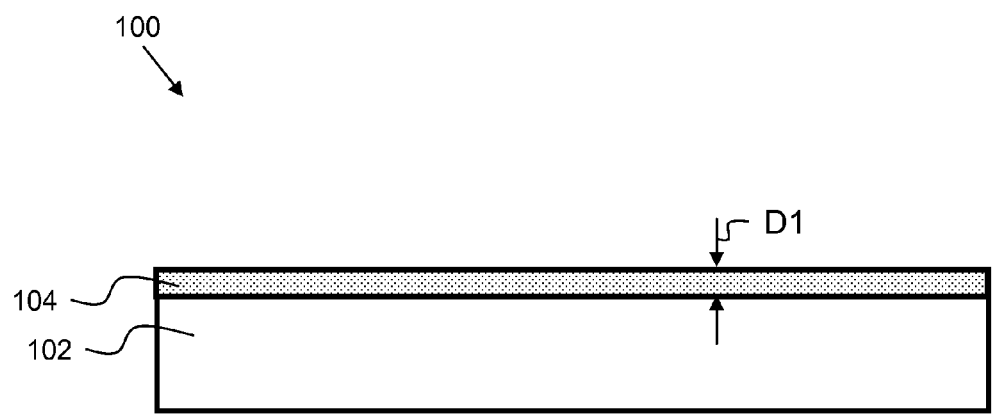

FIG. 1B shows a semiconductor structure after a subsequent process step of performing a surface oxidation in accordance with illustrative embodiments.

Figure 1C:
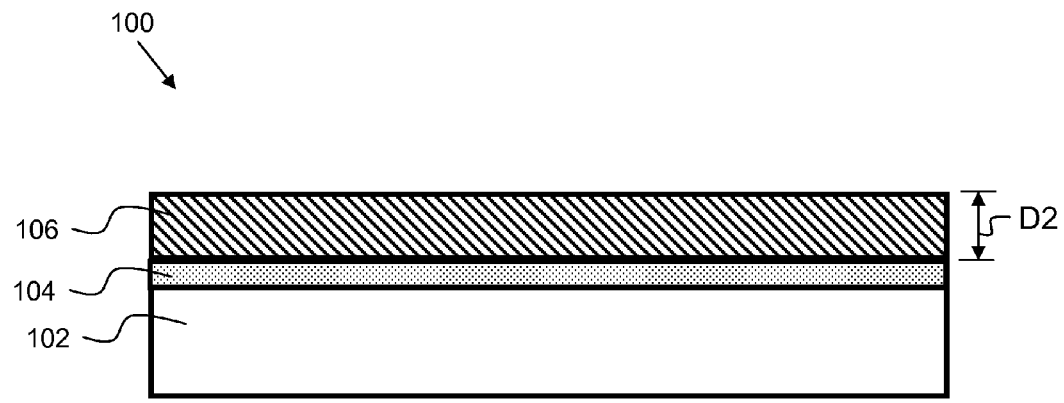

FIG. 1C shows a semiconductor structure after a subsequent process step of depositing a first dielectric layer in accordance with illustrative embodiments.

Figure 1D:
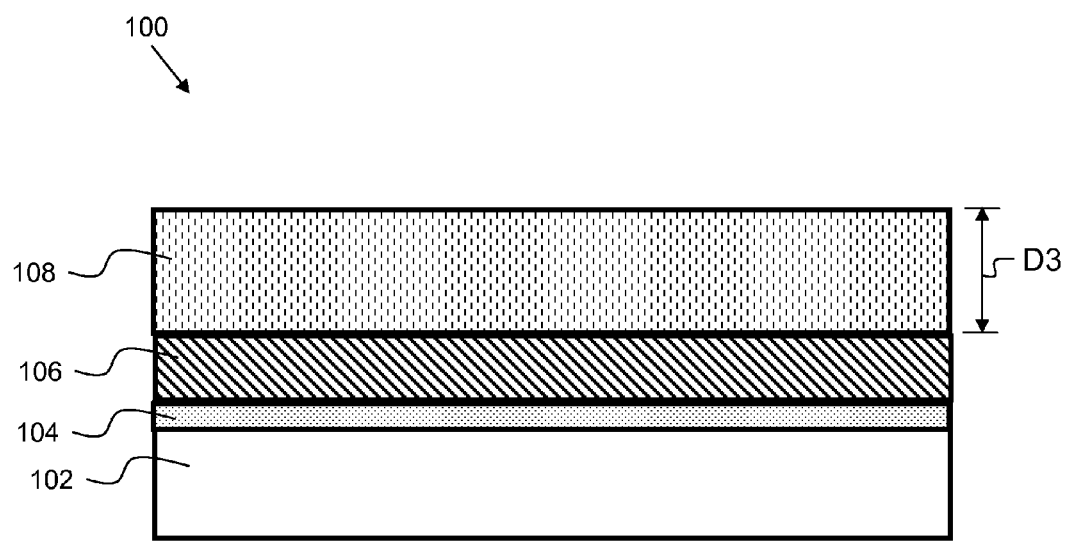

FIG. 1D shows a semiconductor structure after a subsequent process step of depositing a second dielectric layer in accordance with illustrative embodiments.

Figure 2:
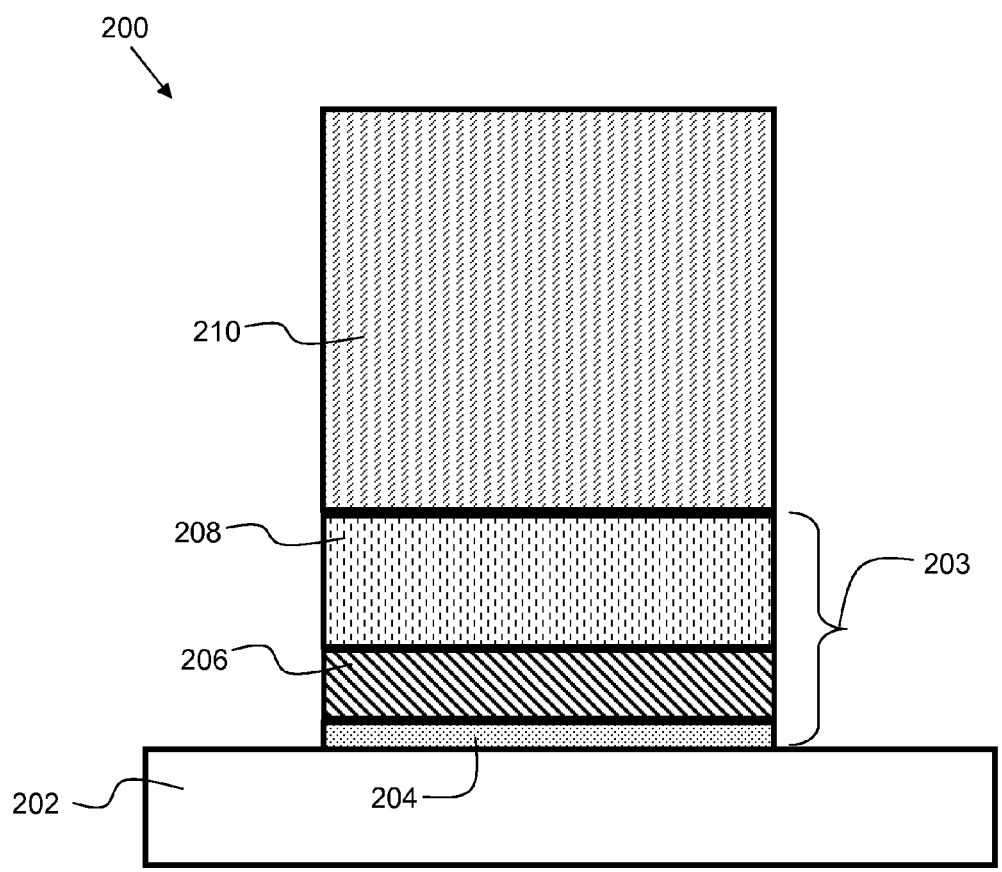

FIG. 2 shows a transistor gate structure in accordance with illustrative embodiments.

Figure 3:
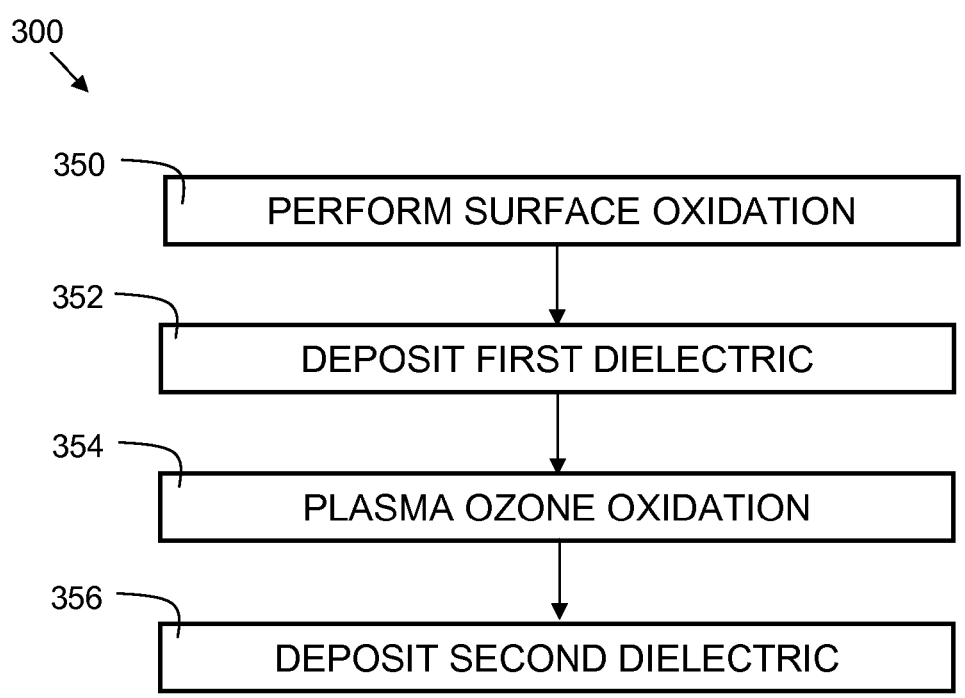

FIG. 3 is a flowchart indicating process steps for illustrative embodiments.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g., a second layer), wherein intervening elements, such as an interface structure (e.g., interface layer), may be present between the first element and the second element.

FIG. 1A shows a semiconductor structure 100 at a starting point for embodiments of the present invention. Semiconductor structure 100 comprises semiconductor substrate 102. In embodiments, semiconductor substrate 102 is a silicon germanium or germanium substrate. In embodiments, the silicon germanium substrate may be of the form Si(1-x)Ge(x), where x ranges from about 0.25 to about 1.0. Substrate 102 may be used to form fins and/or source/drain regions of a transistor in subsequent processing.

FIG. 1B shows semiconductor structure 100 after a subsequent process step of performing a surface oxidation in accordance with illustrative embodiments. As a result of the surface oxidation, an oxidized top surface region 104 is formed on the top surface of semiconductor substrate 102. The oxidized surface region 104 serves as an interfacial oxide layer and has a thickness D1. In embodiments, thickness D1 ranges from about 2 angstroms to about 5 angstroms. In embodiments, the oxidized surface region 104 is formed by a remote plasma oxidation process. In such a process, a plasma is formed in a remote plasma region of a processing tool, and then the plasma is flowed to a processing region of a process chamber of a tool where the semiconductor substrate 102 is disposed, creating a very thin oxidized surface region 104. This method provides a precise control over an interfacial layer (IL) and control over Ge oxide species.

FIG. 1C shows semiconductor structure 100 after a subsequent process step of depositing a first dielectric layer 106 in accordance with illustrative embodiments. In embodiments, the first dielectric layer comprises aluminum oxide ($Al_2O_3$). In other embodiments, the first dielectric layer comprises silicon nitride ($Si_3N_4$) or lanthanum oxide ($La_2O_3$). The first dielectric layer 106 serves as a diffusion barrier for oxygen, which serves to preserve the oxidized surface region 104. Additionally, first dielectric layer 106 serves to provide higher thermal stability for a strained SiGe channel. In embodiments, the first dielectric layer 106 is deposited via an atomic layer deposition (ALD) process. The first dielectric layer 106 has a thickness D2. In embodiments, thickness D2 ranges from about 5 angstroms to about 10 angstroms. Following the deposition of the first dielectric layer 106, an additional process step of a densifying plasma ozone oxidation process may be performed. This serves to further densify the oxidized surface region and to further reduce the interface trap density 104.

FIG. 1D shows semiconductor structure 100 after a subsequent process step of depositing a second dielectric layer 108 in accordance with illustrative embodiments. In embodiments, the second dielectric layer comprises titanium oxide ($TiO_2$). In other embodiments, the second dielectric layer comprises hafnium oxide ($HfO_2$). In other embodiments, the second dielectric layer comprises lanthanum oxide ($La_2O_3$). In embodiments, the second dielectric layer 108 is deposited via an atomic layer deposition (ALD) process. The second dielectric layer 108 has a thickness D3. In some embodiments, thickness D3 ranges from about 13 angstroms to about 17 angstroms. In some embodiments, thickness D3 ranges from about 25 angstroms to about 35 angstroms. In particular, when the second dielectric layer 108 is comprised of hafnium oxide, the thickness D3 may range from about 8 angstroms to about 17 angstroms. However, when the second dielectric layer 108 is comprised of titanium oxide, the thickness D3 may range from about 25 angstroms to about 35 angstroms. This is because the dielectric constant of titanium (40 to 85) is higher than that of hafnium oxide (~19-21). This is advantageous in a variety of aspects. The use of titanium oxide allows a thicker physical film to be formed while preserving a reduced EOT. Furthermore, the increased physical thickness serves to reduce undesirable device leakage when the film is used as a gate dielectric. The first dielectric layer 106 acts as a barrier between the interfacial layer (IL) or oxidized surface region 104 and the second dielectric layer 108, and serves to prevent Ge diffusion into high-k and oxygen diffusion from high-k to SiGe substrate, which would adversely affect device performance. Embodiments of the present invention also utilize titanium oxide as the second dielectric layer due to higher dielectric constant. In addition, due to higher dielectric constant, a thicker film can be used without increasing EOT, while improving device leakage characteristics.

FIG. 2 shows a transistor gate structure 200 in accordance with illustrative embodiments. Gate structure 200 comprises semiconductor substrate 202. In embodiments, semiconductor substrate 202 is a silicon germanium substrate. In embodiments, the silicon germanium substrate may be of the form Si(1-x)Ge(x), where x ranges from about 0.25 to about 1.0. Gate structure 200 comprises gate electrode 210, which is disposed on gate dielectric 203, which is in turn disposed on semiconductor substrate 202. The gate dielectric 203 is comprised of an oxidized surface region 204, a first dielectric layer 206 disposed on the oxidized surface region 204, and a second dielectric layer 208 disposed on the first dielectric layer 206. In embodiments, gate dielectric 203 is fabricated as described and shown in FIGS. 1A-1D. In embodiments, the gate electrode 210 may be comprised of tungsten. Additional metal layers, such as work function layers (not shown), may also be present within the gate electrode 210. Second dielectric layer 208 is a high-K dielectric layer (k>5) and may be comprised of hafnium oxide, titanium oxide, zirconium oxide, or lanthanum oxide. Other high-K materials may also be possible, and embodiments of the present invention are not limited to these materials. In embodiments, the first dielectric layer 206 may be comprised of aluminum oxide or silicon nitride. The oxidized surface region 204 may be formed using a remote plasma oxidation process. A recess process may be performed to remove the portion of the oxidized surface region that is not directly underneath the gate electrode 210. From this point forward, industry-standard process steps such as spacer formation, source/drain formation, implantation, back end of line (BEOL) wiring, and packaging, may be performed to complete a functional integrated circuit.

FIG. 3 is a flowchart 300 indicating process steps for illustrative embodiments. In process step 350, a surface oxidation is performed. This may include a remote plasma oxidation process. When performed on a silicon germanium substrate, the resulting surface oxide is a combination of silicon oxide and germanium oxide. In process step 352, a first dielectric layer is deposited. This may be performed using atomic layer deposition (ALD). In embodiments, the first dielectric layer may include aluminum oxide, silicon nitride or lanthanum oxide. In process step 354, a plasma ozone oxidation process is performed. This serves to further densify the surface oxidation layer. In process step 356, a second dielectric is deposited. In embodiments, the second dielectric may include, but is not limited to, titanium oxide, hafnium oxide, and lanthanum oxide. The second dielectric preferably has a very high dielectric constant value (e.g., k>20) such that it enables the deposition of a thicker film (e.g. 25 to 35 angstroms) while still maintaining an acceptable EOT. Thus, embodiments of the present invention enable a dielectric film with improved manufacturability, reduced EOT and Dit, and improved device leakage characteristics.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, the method comprising:
   performing a surface oxidation of a semiconductor substrate to form an interfacial oxide layer;
   depositing a first dielectric layer on the interfacial oxide layer;
   performing a densifying process to densify the surface oxidation of said first dielectric layer; and
   depositing a second dielectric layer on the first dielectric layer.

2. The method of claim 1, wherein performing a surface oxidation comprises performing a remote plasma oxidation process.

3. The method of claim 1, wherein forming an interfacial oxide layer comprises forming an interfacial oxide layer having a thickness ranging from about 2 angstroms to about 5 angstroms.

4. The method of claim 2, wherein performing a surface oxidation of a semiconductor substrate comprises performing a surface oxidation of a silicon germanium substrate.

5. The method of claim 1, wherein depositing a first dielectric layer is performed using an atomic layer deposition process.

6. The method of claim 1, wherein depositing a first dielectric layer comprises depositing aluminum oxide.

7. The method of claim 1, wherein depositing a first dielectric layer comprises depositing silicon nitride.

8. The method of claim 1, further comprising performing a plasma ozone oxidation process.

9. The method of claim 1 wherein depositing a second dielectric layer comprises depositing titanium oxide.

10. The method of claim 1 wherein depositing a second dielectric layer comprises depositing hafnium oxide.

11. The method of claim 1 wherein depositing a second dielectric layer comprises depositing zirconium oxide.

12. The method of claim 1 wherein depositing a second dielectric layer comprises depositing lanthanum oxide.

13. A method of forming a semiconductor structure, the method comprising:
   performing a surface oxidation process upon a semiconductor substrate to form an interfacial oxide layer, wherein said interfacial oxide layer having a thickness ranging from about 2 angstroms to about 5 angstroms;
   depositing a first dielectric layer on the interfacial oxide layer; and
   depositing a second dielectric layer on the first dielectric layer.

14. The method of claim 13, wherein said surface oxidation process upon comprises performing a remote plasma oxidation process upon a silicon germanium substrate.

15. The method of claim 13, wherein depositing said first dielectric layer is performed using an atomic layer deposition process.

16. The method of claim 13, wherein depositing said first dielectric layer comprises depositing at least one of:
   depositing silicon nitride; or
   depositing aluminum oxide.

17. The method of claim 13, further comprising performing a plasma ozone oxidation process.

18. The method of claim 13 wherein depositing said second dielectric layer comprises at least one of:
   depositing titanium oxide;
   depositing hafnium oxide;
   depositing zirconium oxide; or
   depositing lanthanum oxide.

19. The method of claim 13, wherein performing said surface oxidation comprises performing a remote plasma oxidation process.

20. The method of claim 13, further comprising performing a densifying process to densify the surface of said first dielectric layer.

* * * * *